(12) United States Patent
Murakami et al.

(10) Patent No.: US 12,719,006 B2
(45) Date of Patent: Aug. 25, 2026

(54) CHARGED PARTICLE BEAM DEVICE

(71) Applicant: Hitachi High-Tech Corporation, Tokyo (JP)

(72) Inventors: Shinichi Murakami, Tokyo (JP); Tomoyo Sasaki, Tokyo (JP); Yuuji Kasai, Tokyo (JP); Yuzuru Mizuhara, Tokyo (JP); Wen Li, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 547 days.

(21) Appl. No.: 17/783,788

(22) PCT Filed: Dec. 16, 2019

(86) PCT No.: PCT/JP2019/049124
§ 371 (c)(1),
(2) Date: Jun. 9, 2022

(87) PCT Pub. No.: WO2021/124382
PCT Pub. Date: Jun. 24, 2021

(65) Prior Publication Data

US 2023/0010272 A1 Jan. 12, 2023

(51) Int. Cl.
*H01J 37/04* (2006.01)
*H01J 37/24* (2006.01)
*H01J 37/28* (2006.01)

(52) U.S. Cl.
CPC ............ *H01J 37/045* (2013.01); *H01J 37/24* (2013.01); *H01J 37/28* (2013.01)

(58) Field of Classification Search
None
See application file for complete search history.

(56) References Cited

U.S. PATENT DOCUMENTS 4,710,640 A * 12/1987 Kawasaki .............. B82Y 10/00 219/121.25
6,483,117 B1 * 11/2002 Clement ................ G21K 1/087 250/492.1

(Continued)

FOREIGN PATENT DOCUMENTS

CN 103077876 A 5/2013
JP 2001036399 A 2/2001

(Continued)

OTHER PUBLICATIONS

Search Report mailed Feb. 25, 2020 in International Application No. PCT/JP2019/049124.

(Continued)

*Primary Examiner* — Eliza W Osenbaugh-Stewart
(74) *Attorney, Agent, or Firm* — Miles & Stockbridge, P.C.

(57) ABSTRACT

Provided is a charged particle beam device with low blanking noise and improved signal detection accuracy. As means therefor, a charged particle beam device is configured by: a stage where a sample is mountable; a charged particle gun performing charged particle emission to the sample; a voltage source; a first switching circuit to which a voltage is supplied from the voltage source; a second switching circuit having one end connected to a ground; a third switching circuit having one end connected to the ground; a fourth switching circuit to which a voltage is supplied from the voltage source; a first blanking electrode connected to the first switching circuit and the second switching circuit; a second blanking electrode facing the first blanking electrode and connected to the third switching circuit and the fourth switching circuit; and a control circuit controlling the first switching circuit, the second switching circuit, the third switching circuit, and the fourth switching circuit.

9 Claims, 10 Drawing Sheets

(56) References Cited

U.S. PATENT DOCUMENTS

| | | | | |
|---|---|---|---|---|
| 7,495,877 | B2 * | 2/2009 | Havanur ............. | H02M 3/1588 361/111 |
| 9,977,337 | B2 | 5/2018 | Kojima et al. | |
| 2007/0075256 | A1 | 4/2007 | Buller et al. | |
| 2016/0064179 | A1 | 3/2016 | Yamashita et al. | |
| 2017/0090298 | A1 | 3/2017 | Kojima et al. | |
| 2018/0151327 | A1 | 5/2018 | Budach et al. | |
| 2019/0318906 | A1 | 10/2019 | Li et al. | |

FOREIGN PATENT DOCUMENTS

| | | | |
|---|---|---|---|
| JP | 2016054291 | A | 4/2016 |
| JP | 2019133789 | A | 8/2019 |
| KR | 10-2016-0028385 | A | 3/2016 |
| TW | 201618153 | A | 5/2016 |
| TW | 201721698 | A | 6/2017 |
| TW | 201805996 | A | 2/2018 |
| WO | 2017194333 | A1 | 11/2017 |

OTHER PUBLICATIONS

Written Opinion mailed Feb. 25, 2020 in International Application No. PCT/JP2019/049124.

International Preliminary Report on Patentability mailed Sep. 1, 2020 in International Application No. PCT/JP2019/049124.

Office Action mailed Sep. 13, 2023 in Taiwanese Application No. 111139584.

Office Action mailed Jul. 26, 2024 in Korean Application No. 10-2022-7017990.

* cited by examiner

[FIG. 1]
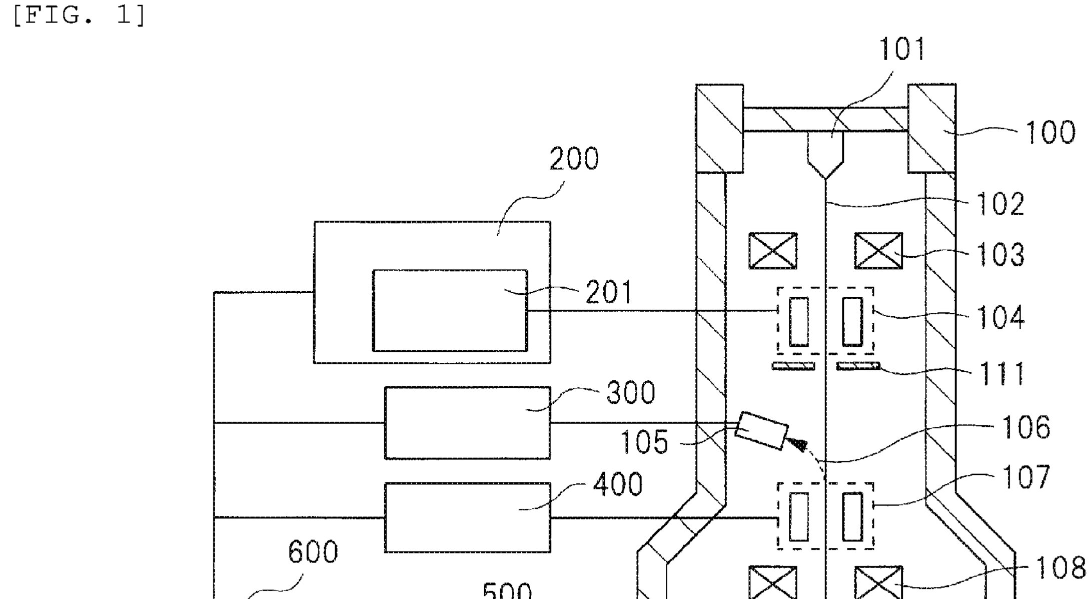
[FIG. 2]
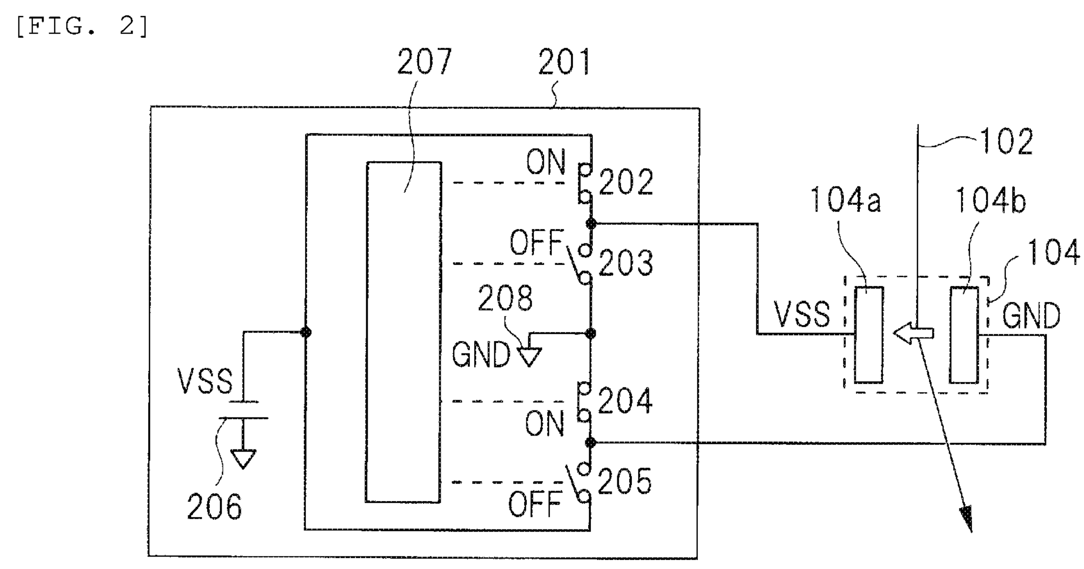

[FIG. 3]
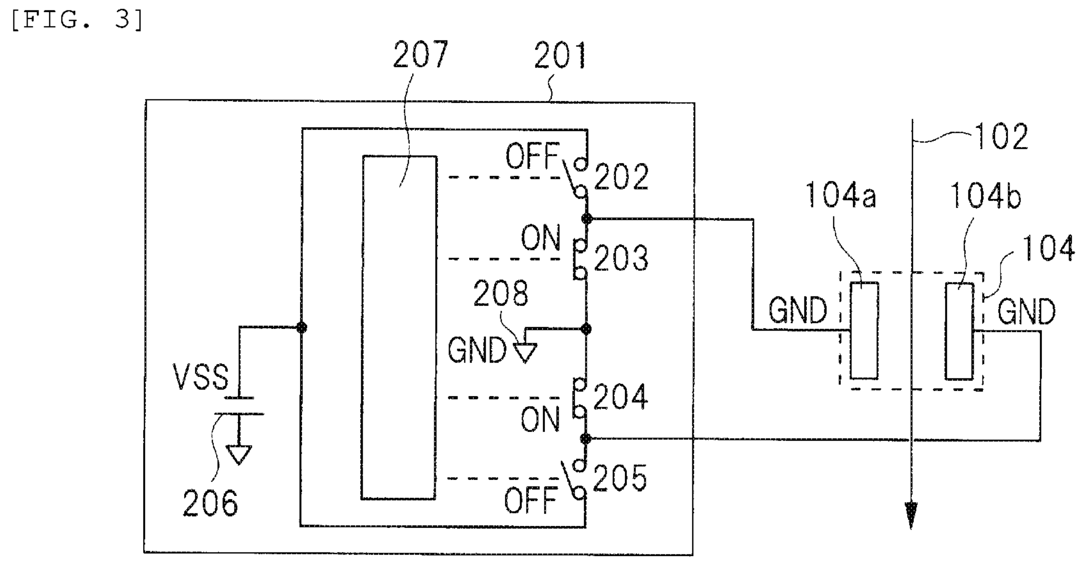
[FIG. 4]
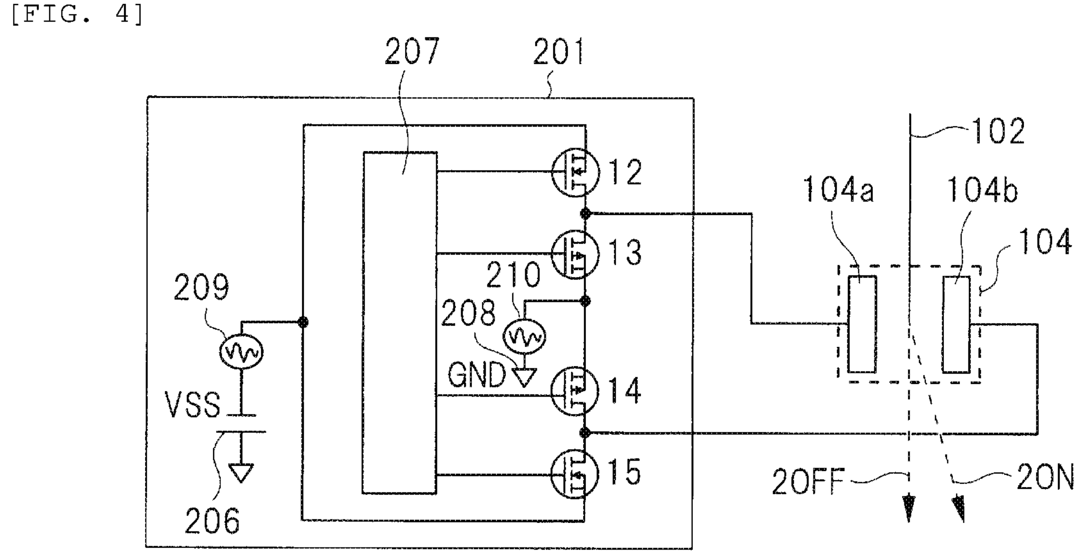

[FIG. 5]
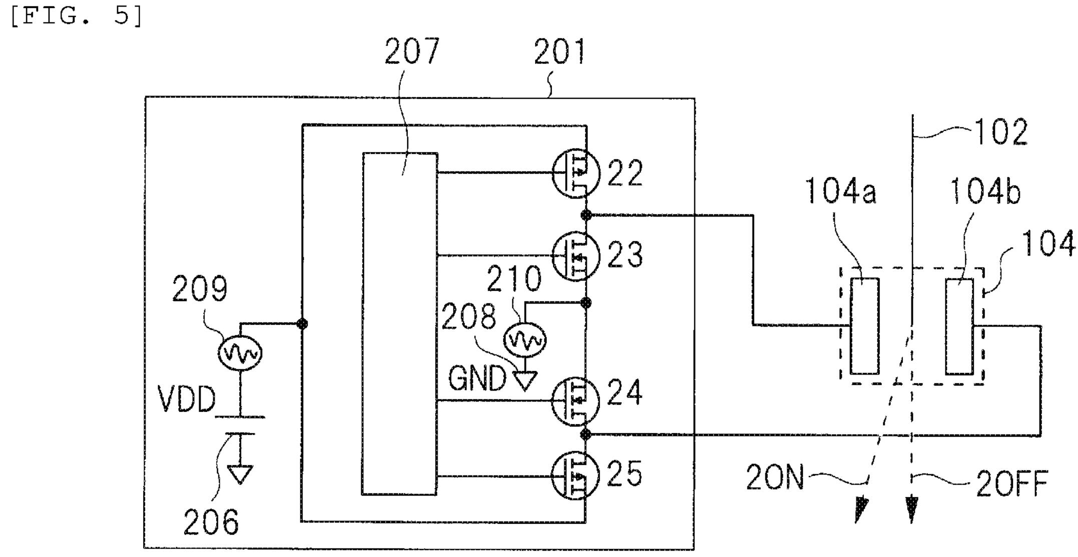
[FIG. 6]
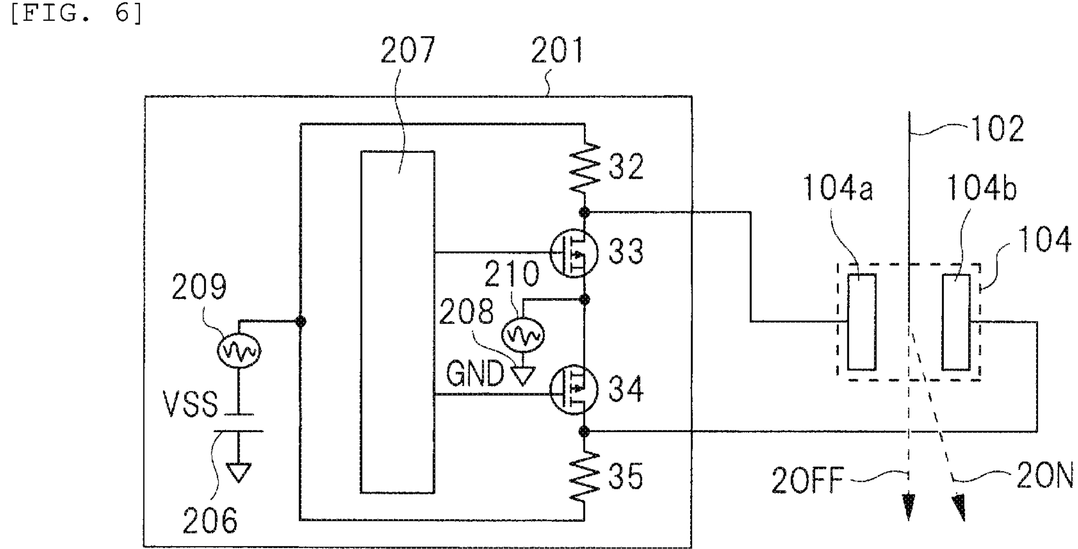

[FIG. 7]
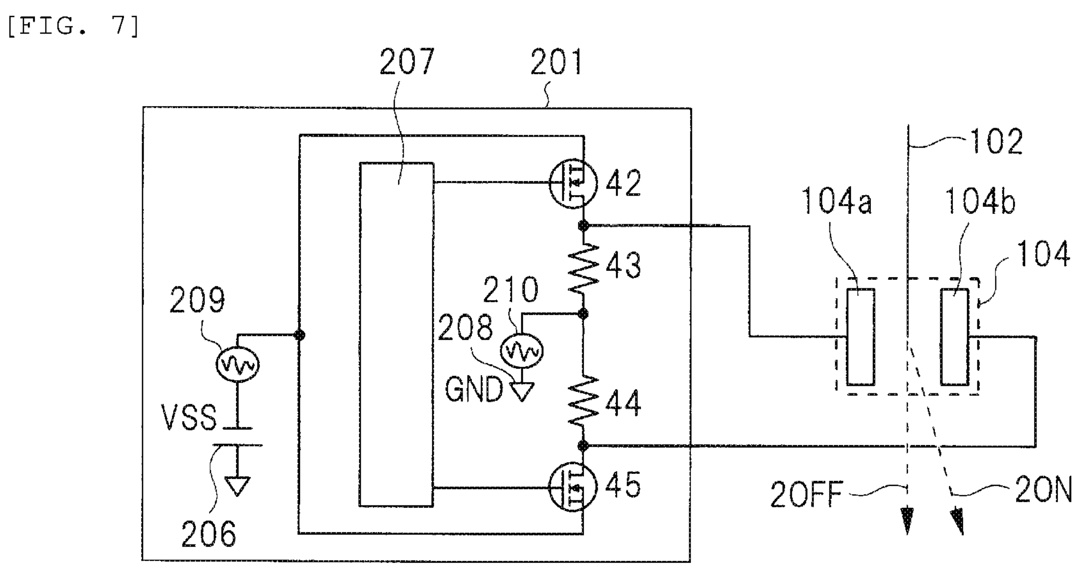
[FIG. 8]
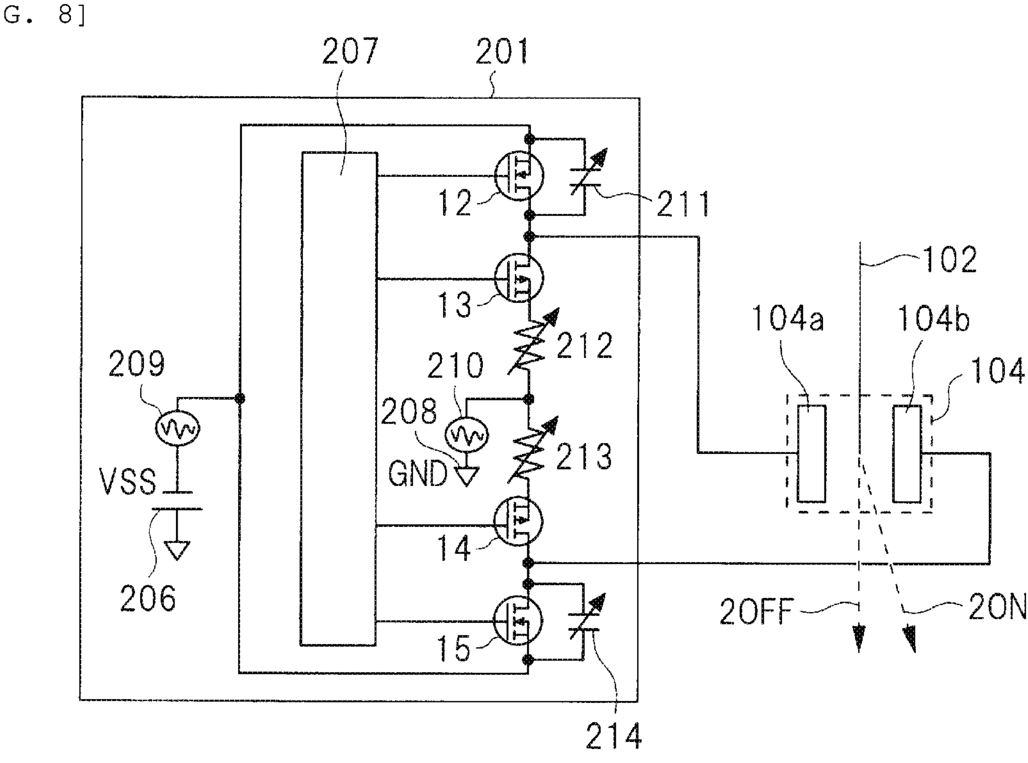

[FIG. 9]
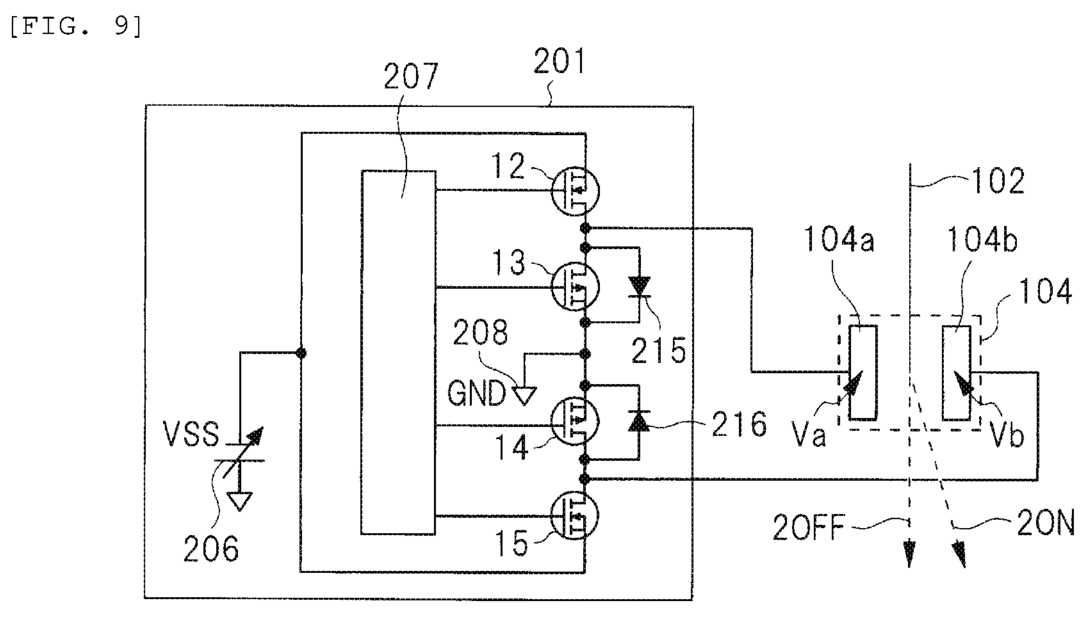
[FIG. 10]
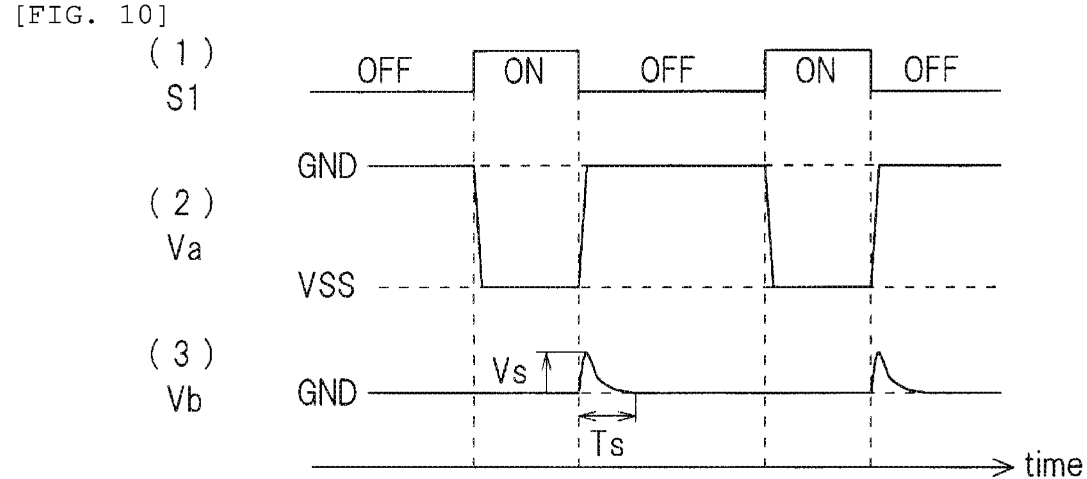

[FIG. 11]
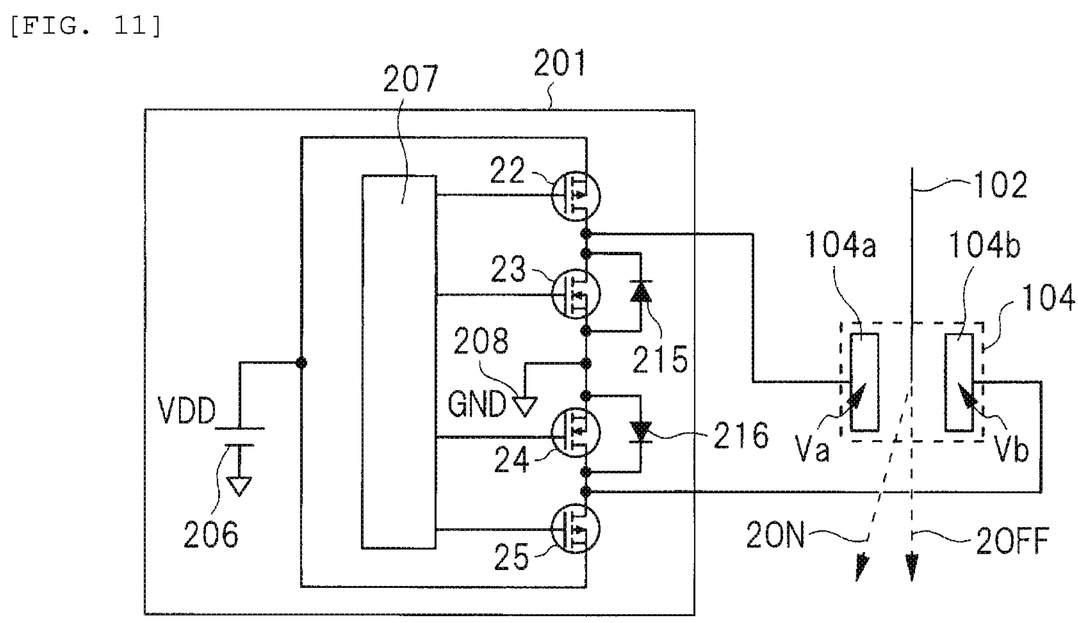
[FIG. 12]
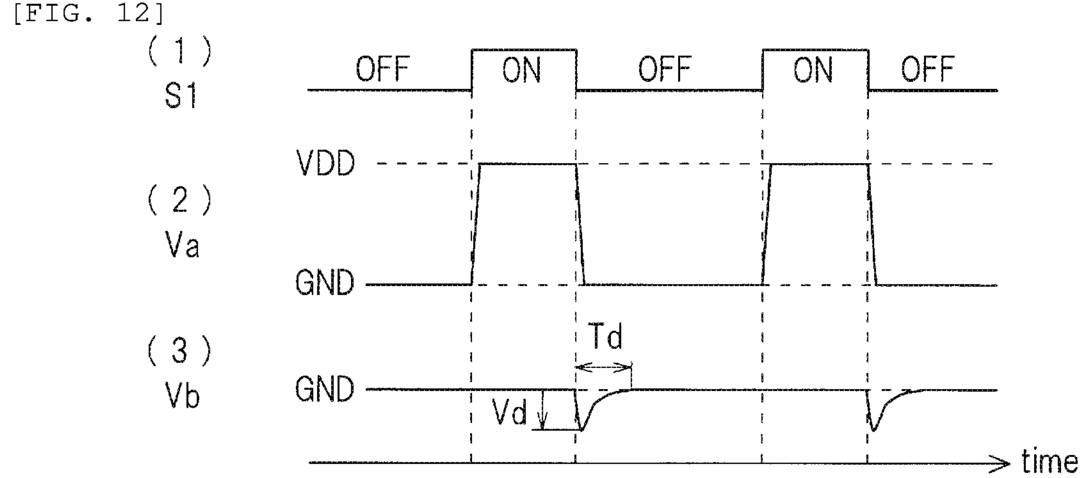

[FIG. 13]
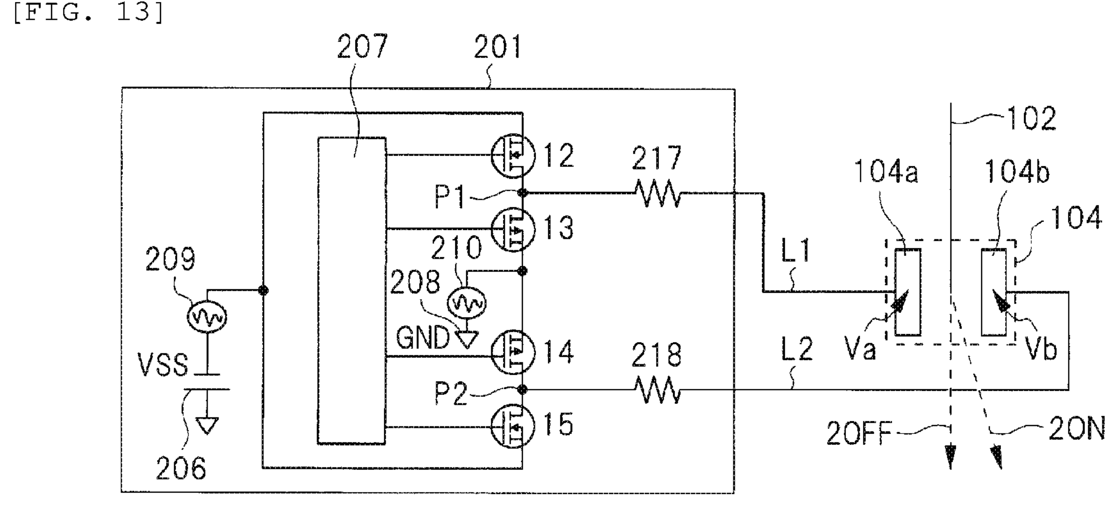
[FIG. 14]
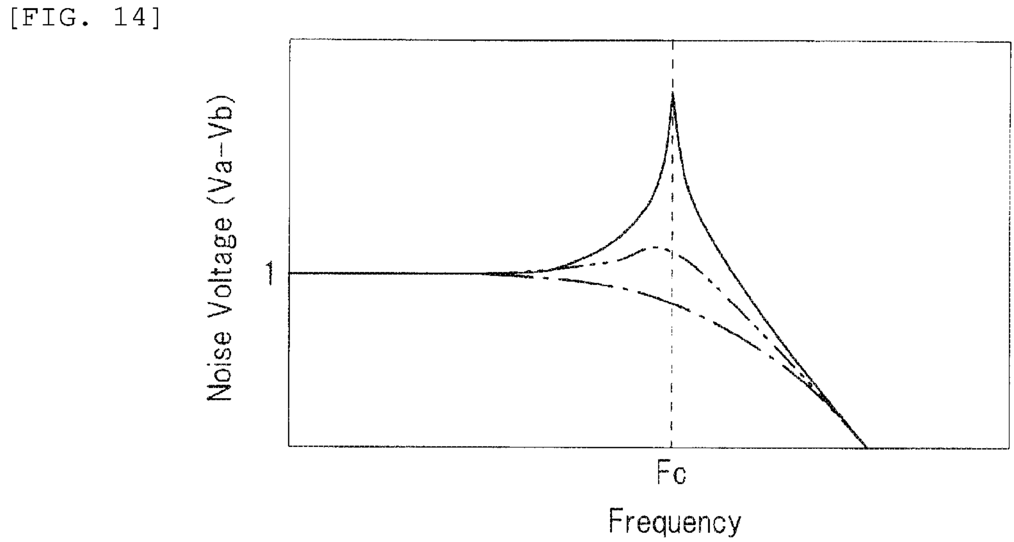

[FIG. 15]
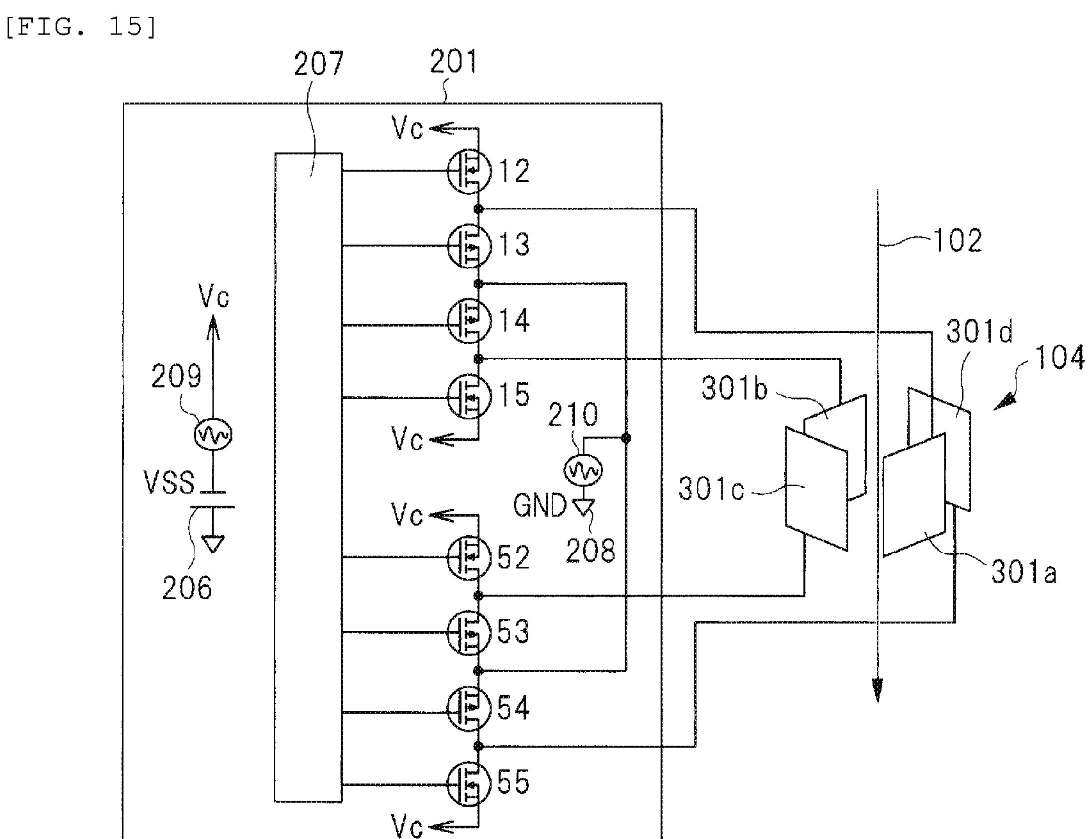
[FIG. 16]
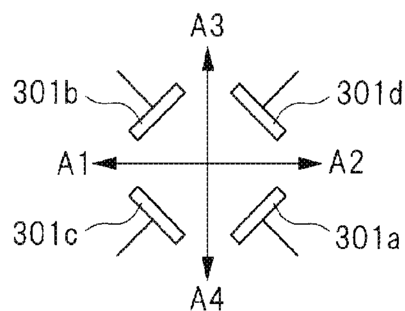

[FIG. 17]
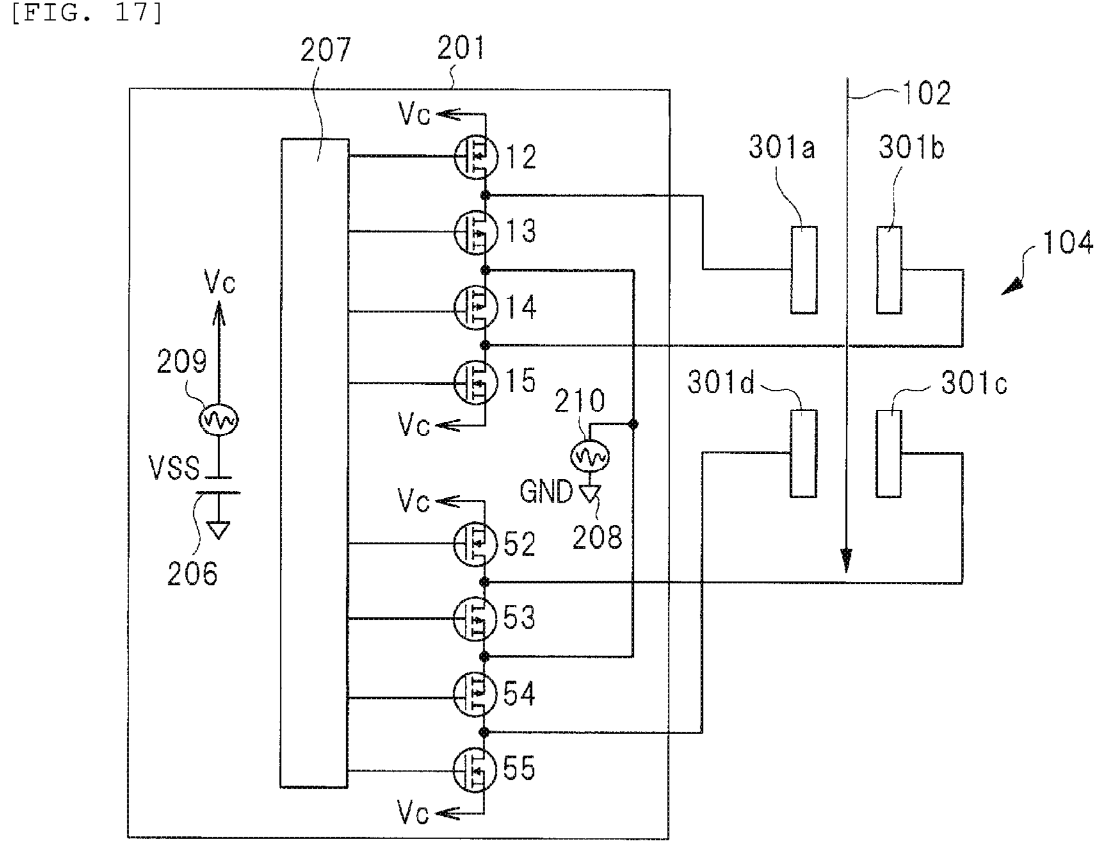
[FIG. 18]
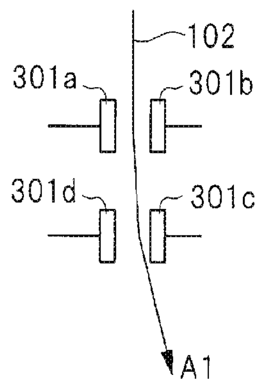

[FIG. 19]
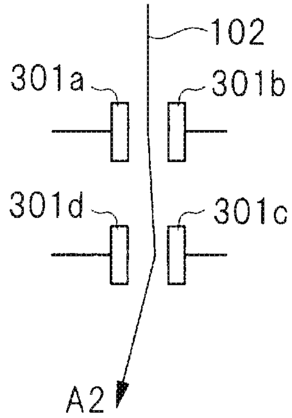
[FIG. 20]
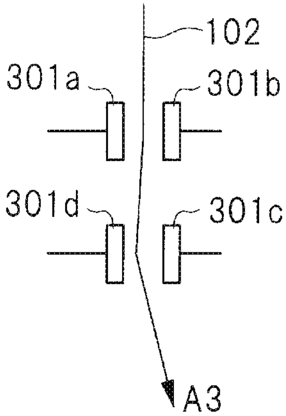
[FIG. 21]
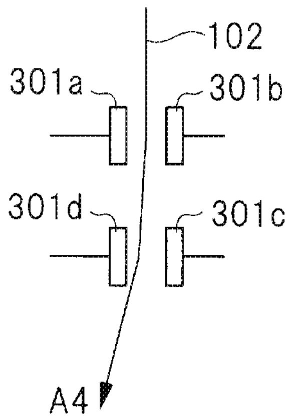

CHARGED PARTICLE BEAM DEVICE

TECHNICAL FIELD

The present invention relates to a charged particle beam device and can be used particularly for a charged particle beam device that blocks an electron beam by blanking.

BACKGROUND ART

A charged particle beam device represented by, for example, a scanning electron microscope irradiates a sample with a charged particle beam, converts backscattered or secondary electrons from the sample into an electric signal with a detector such as a scintillator and a photomultiplier tube, and measures the dimensions of the fine pattern formed on the sample through an amplifier circuit, an arithmetic processing circuit, and a display.

Nowadays, with the progress of three-dimensionalization of semiconductor patterns, it is required to measure the dimensions of deep grooves and deep holes with high accuracy. Most of the electrons released from the bottom of a deep groove or deep hole collide with the side surface of the groove or hole and are scattered, and thus the amount of detected electrons is small. When noise generated in a device is superimposed on a detection signal, the signal-to-noise ratio (SNR) extremely decreases and the accuracy of dimensional measurement decreases. Accordingly, it is required to improve the measurement accuracy by increasing the acceleration voltage of an electron beam as compared with the device of the related art and increasing the number of electrons released from the bottom of the deep groove or deep hole.

As a method for responding to the high acceleration of an electron beam and performing low-noise blanking, for example, PTL 1 (JP-A-2019-133789) discloses a blanking control circuit in which two stages of blanking electrodes are installed above and below in an electron beam irradiation direction, and of the two facing electrodes in the respective stages of blanking electrodes disposed in the same direction, the electrodes on opposite sides and a ground are connected. Here, when the blanking is ON, a positive voltage is output to the remaining electrode of the upper blanking electrodes and a negative voltage is output to the remaining electrode of the lower blanking electrodes. In addition, when the blanking is OFF, the same ground reference signal is output to the remaining electrodes of the upper and lower blanking electrodes.

CITATION LIST

Patent Literature

PTL 1: JP-A-2019-133789

SUMMARY OF INVENTION

Technical Problem

On condition that noise is applied to the blanking electrode when the blanking control circuit blocking an electron beam is OFF, there is a problem that the electron beam is emitted in an unintended direction and a decline in measurement accuracy arises. The noise applied to the blanking electrode is noise intruding from a GND terminal or power supply noise.

According to PTL 1, noise electric fields are generated in opposite directions in the upper and lower two-stage blanking electrodes and electron beam fluctuations attributable to the noise electric fields are offset by the upper and lower two-stage blanking electrodes to reduce noise. However, the upper and lower two-stage blanking electrodes have a difference in deflection sensitivity to an electron beam. Accordingly, in order to offset the noise electric fields with the upper and lower two-stage blanking electrodes, means for adjusting the noise voltage applied to the blanking electrode in accordance with the deflection sensitivity is required, which is difficult to realize. In addition, the noise targeted by PTL 1 is assumed to be noise intruding from a GND terminal of a blanking control circuit, and power supply noise is not considered.

An object of the present invention is to solve the above problems of the related art and provide a charged particle beam device provided with a low-noise blanking control circuit.

Other objects and novel features will become apparent from the description and accompanying drawings herein.

Solution to Problem

The following is a brief outline of a representative embodiment disclosed in the present application.

A charged particle beam device according to one embodiment includes: a stage where a sample is mountable; a charged particle gun performing charged particle emission to the sample; a voltage source; a first switching circuit to which a voltage is supplied from the voltage source; a second switching circuit having one end connected to a ground; a third switching circuit having one end connected to the ground; a fourth switching circuit to which a voltage is supplied from the voltage source; a first blanking electrode connected to the first switching circuit and the second switching circuit; a second blanking electrode facing the first blanking electrode and connected to the third switching circuit and the fourth switching circuit; and a control circuit controlling the first switching circuit, the second switching circuit, the third switching circuit, and the fourth switching circuit.

Advantageous Effects of Invention

According to the representative embodiment, the performance of the charged particle beam device can be improved. In particular, the measurement accuracy of the charged particle beam device can be improved.

BRIEF DESCRIPTION OF DRAWINGS

FIG. 1 is a schematic diagram illustrating the configuration of a charged particle beam device according to a first embodiment of the present invention.

FIG. 2 is a conceptual diagram of a blanking control circuit according to the first embodiment of the present invention.

FIG. 3 is a conceptual diagram of the blanking control circuit according to the first embodiment of the present invention.

FIG. 4 is a circuit diagram illustrating the blanking control circuit according to the first embodiment of the present invention.

FIG. 5 is a circuit diagram illustrating a blanking control circuit according to a first modification example of the first embodiment of the present invention.

FIG. 6 is a circuit diagram illustrating a blanking control circuit according to a second modification example of the first embodiment of the present invention.

FIG. 7 is a circuit diagram illustrating a blanking control circuit according to a third modification example of the first embodiment of the present invention.

FIG. 8 is a circuit diagram illustrating a blanking control circuit according to a second embodiment of the present invention.

FIG. 9 is a circuit diagram illustrating a blanking control circuit according to a third embodiment of the present invention.

FIG. 10 is a waveform diagram illustrating a blanking control signal and a voltage applied to a blanking electrode in the blanking control circuit according to the third embodiment of the present invention.

FIG. 11 is a circuit diagram illustrating a blanking control circuit according to a modification example of the third embodiment of the present invention.

FIG. 12 is a waveform diagram illustrating a blanking control signal and a voltage applied to a blanking electrode in the blanking control circuit according to the modification example of the third embodiment of the present invention.

FIG. 13 is a circuit diagram illustrating a blanking control circuit according to a fourth embodiment of the present invention.

FIG. 14 is a graph illustrating the frequency characteristics of a noise voltage applied to a blanking electrode according to the fourth embodiment of the present invention.

FIG. 15 is a circuit diagram illustrating a blanking control circuit according to a fifth embodiment of the present invention.

FIG. 16 is a plan view illustrating a positional relationship of a method for electron beam deflection by blanking according to the fifth embodiment of the present invention.

FIG. 17 is a circuit diagram illustrating a blanking control circuit according to a sixth embodiment of the present invention.

FIG. 18 is a side view illustrating a positional relationship of a method for electron beam deflection by blanking according to the sixth embodiment of the present invention.

FIG. 19 is a side view illustrating a positional relationship of the method for electron beam deflection by blanking according to the sixth embodiment of the present invention.

FIG. 20 is a side view illustrating a positional relationship of the method for electron beam deflection by blanking according to the sixth embodiment of the present invention.

FIG. 21 is a side view illustrating a positional relationship of the method for electron beam deflection by blanking according to the sixth embodiment of the present invention.

DESCRIPTION OF EMBODIMENTS

Hereinafter, embodiments of the present invention will be described in detail with reference to the drawings. It should be noted that in all the drawings for describing the embodiments, members having the same function are denoted by the same reference numerals with redundant description omitted. In addition, in the embodiments, the description of the same or similar parts is not repeated in principle unless it is particularly necessary.

First Embodiment

FIG. 1 is a schematic diagram illustrating an example of the configuration of a charged particle beam device according to a first embodiment of the present invention. As illustrated in FIG. 1, the charged particle beam device includes a column (electron-optical lens barrel) 100, a charged particle gun (electron gun) 101 performing irradiation with (emitting) an electron beam (charged particle beam) 102, and a focusing lens 103 focusing the electron beam 102. The charged particle beam device further includes a deflection electrode 107 changing the direction of the electron beam 102 and controlling the position where scanning with the electron beam 102 is performed on a sample 109, which is an object to be measured, a plurality of blanking electrodes 104 blocking irradiation of the sample 109 by deflecting the electron beam 102 and hitting an aperture 111, and an objective lens 108 refocusing the electron beam 102. The charged particle beam device further includes a stage 110 movable with the sample 109 mounted and a detector 105 detecting a secondary electron 106 released from the sample 109 irradiated with the electron beam 102 and scanned.

In addition, the charged particle beam device includes an electron-optical control unit 200 (including a blanking control circuit 201), a signal detection and image processing unit 300, a deflection control unit 400, a mechanism control unit 500, and an overall control unit 600.

The overall control unit 600 performs processing to control the entire charged particle beam device. For example, the overall control unit 600 performs measurement and inspection processing by controlling, for example, the electron-optical control unit 200, the deflection control unit 400, and the mechanism control unit 500 in accordance with measurement and inspection conditions. When the measurement and inspection are executed, the overall control unit 600 receives image data generated through the signal detection and image processing unit 300 and displays the data on, for example, a graphical user interface (GUI) screen.

The blanking electrode 104 is configured by a set of two metal plates disposed parallel to each other. In other words, the two metal plates are disposed so as to face each other. The electron-optical control unit 200 controls the electron optics system in the column 100 (focusing lens 103, blanking electrode 104, and objective lens 108) in accordance with control from the overall control unit 600. In particular, the blanking control circuit 201 controls the ON/OFF of irradiation of the sample 109 with the electron beam 102 by applying a blanking voltage to the blanking electrode 104 through a signal line based on a blanking control signal supplied from the overall control unit 600. When the blanking control signal is ON, a voltage is applied to the blanking electrode 104, an electric field is generated between the electrodes, and the electron beam 102 is deflected and blocked by the aperture 111. Accordingly, sample 109 is not irradiated with the electron beam 102. In addition, when the blanking control signal is OFF, no voltage is applied to the blanking electrode 104, and thus no electric field is generated between the electrodes and the electron beam 102 passes through the aperture 111 and the sample 109 is irradiated with the electron beam 102.

Next, FIGS. 2 and 3 illustrate an example of a conceptual diagram of the blanking control circuit 201 according to the first embodiment. The blanking electrode 104 of the present embodiment includes a first electrode (blanking electrode) 104*a* and a second electrode (blanking electrode) 104*b* facing each other in a direction perpendicular to the irradiation direction of the electron beam 102 with the irradiation position of the electron beam 102 in the air in the middle. The blanking control circuit 201 includes switching circuits 202 to 205, a voltage source 206 causing (generating) a negative voltage (VSS), and a driver circuit 207 controlling the ON/OFF of the switching circuits 202 to 205 based on a blanking control signal from the overall control unit 600. In other words, the driver circuit 207 is capable of controlling each of the switching circuits 202 to 205 to either an ON state (conducting state) or an OFF state (non-conducting state). The switching circuit referred to here may be a circuit in which a plurality of elements are connected or may be a single-element switching element.

The negative voltage (VSS) output of the voltage source 206 is connected to the first electrode 104*a* via the switching circuit 202 and is connected to the second electrode 104*b* via the switching circuit 205. A common ground (common ground reference point, common GND) 208 provided on the blanking control circuit 201 is connected to the first electrode 104*a* via the switching circuit 203 and is connected to the second electrode 104*b* via the switching circuit 204. In the following description, the common ground 208 is referred to as the common GND 208.

In other words, the blanking control circuit 201 includes the switching circuit (first switching circuit) 202 to which a voltage is supplied from the voltage source 206, the switching circuit (second switching circuit) 203 having one end connected to the common GND 208, the switching circuit (third switching circuit) 204 having one end connected to the common GND 208, and the switching circuit (fourth switching circuit) 205 to which a voltage is supplied from the voltage source 206.

FIG. 2 illustrates a state where the blanking control signal is ON. At this time, the driver circuit 207 connects the negative voltage (VSS) to the first electrode 104*a* and connects the common GND 208 to the second electrode 104*b* by turning on the switching circuits 202 and 204 and turning off the switching circuits 203 and 205. In other words, the negative voltage (VSS) is applied to the first electrode 104*a* and the GND potential is applied to the second electrode 104*b*. As a result, a blanking electric field is generated in the direction from the second electrode 104*b* to the first electrode 104*a* and the electron beam 102 can be deflected. In FIG. 2, the blanking electric field is indicated by a white arrow. By deflecting the electron beam 102 in this manner, the electron beam 102 is blocked and the sample is not irradiated. In other words, blanking is performed.

FIG. 3 illustrates a state where the blanking control signal is OFF. At this time, the driver circuit 207 connects the common GND 208 to the first electrode 104*a* and the second electrode 104*b* by turning on the switching circuits 203 and 204 and turning off the switching circuits 202 and 205. As a result, no blanking electric field is generated between the first electrode 104*a* and the second electrode 104*b* and the sample 109 is irradiated with the electron beam 102.

FIG. 4 illustrates a circuit diagram as a specific configuration example of the blanking control circuit 201 according to the present embodiment.

The switching circuits 202 and 205 here (see FIG. 2) are N-channel metal oxide semiconductor field effect transistors (MOSFETs) 12 and 15. The N-channel MOSFETs 12 and 15 have a source (source terminal) connected to the negative voltage (VSS) and a gate (gate terminal) connected to the driver circuit 207. The drain (drain terminal) of the N-channel MOSFET 12 is connected to the first electrode 104*a*, and the drain of the N-channel MOSFET 15 is connected to the second electrode 104*b*. In addition, the switching circuits 203 and 204 here (see FIG. 2) are P-channel MOSFETs 13 and 14. The P-channel MOSFETs 13 and 14 have a source connected to the common GND 208 and a gate connected to the driver circuit 207. The drain of the P-channel MOSFET 13 is connected to the first electrode 104*a*, and the drain of the P-channel MOSFET 14 is connected to the second electrode 104*b*.

In addition, FIG. 4 illustrates a power supply noise 209 and a GND noise 210 in order to describe a low-noise effect in the present embodiment. The power supply noise 209 is, for example, noise output by the voltage source 206 and includes, for example, high-frequency spike noise or ripple noise entailed by switching. The GND noise 210 is a noise component generated in the common GND 208. Included in the GND noise 210 is, for example, a GND potential fluctuation caused by the return of the current consumed by an element on the blanking control circuit 201 or the like flowing through the GND, noise generated by another circuit or the like on the charged particle beam device and conducted, or noise mixed in the blanking control circuit 201 due to radiation.

In FIG. 4, an electron beam 20N is illustrated as the trajectory of the electron beam 102 when the blanking is ON and an electron beam 2OFF is illustrated as the trajectory of the electron beam 102 when the blanking is OFF. This also applies to FIGS. 5 to 9, 11, and 13, which will be used later.

In FIG. 4, when the blanking control signal is ON, the driver circuit 207 connects the negative voltage (VSS) to the first electrode 104*a* and connects the common GND 208 to the second electrode 104*b* by turning on the N-channel MOSFET 12 and the P-channel MOSFET 14 and turning off the P-channel MOSFET 13 and the N-channel MOSFET 15. As a result, a blanking electric field is generated between the electrodes and the electron beam 102 can be deflected.

In addition, when the blanking control signal is OFF, the driver circuit 207 connects the common GND 208 to the first electrode 104*a* and the second electrode 104*b* by turning off the N-channel MOSFETs 12 and 15 and turning on the P-channel MOSFETs 13 and 14. At this time, the GND noise 210 is conducted to the first electrode 104*a* and the second electrode 104*b* mainly via the on-resistances of the P-channel MOSFETs 13 and 14, respectively. The GND noise 210 is applied to the first electrode 104*a* and the second electrode 104*b* with the same amplitude and phase, and thus the GND noise 210 generates no electric field between the electrodes. In addition, the power supply noise 209 is conducted to the first electrode 104*a* and the second electrode 104*b* mainly via the parasitic capacitances between the drains and the sources of the N-channel MOSFETs 12 and 15, respectively. The power supply noise 209 is also applied to the first electrode 104*a* and the second electrode 104*b* with the same amplitude and phase, and thus the power supply noise 209 generates no electric field between the electrodes. Accordingly, noise reduction can be realized.

Effect of Present Embodiment

In a charged particle beam device performing blanking to block an electron beam, noise may be applied to one of facing blanking electrodes when a blanking control circuit is OFF. In this case, there is a problem that an electric field is generated between the blanking electrodes, irradiation is performed with the electron beam bent in an unintended direction, and a decline in measurement accuracy occurs. In other words, when the blanking control circuit is OFF, it is important to prevent electron beam deflection attributable to noise and irradiate a sample with an electron beam straight.

In this regard, the N-channel MOSFET 12 connected between the voltage source 206 and the first electrode 104*a*, the N-channel MOSFET 15 connected between the voltage source 206 and the second electrode 104*b*, the P-channel MOSFET 13 connected between the common GND 208 and the first electrode 104*a*, and the P-channel MOSFET 14 connected between the common GND 208 and the second electrode 104*b* are provided in the present embodiment.

When the blanking control signal is turned off, both the N-channel MOSFETs 12 and 15 are turned off. Even with both the N-channel MOSFETs 12 and 15 OFF, the power supply noise 209 is conducted to the first electrode 104*a* and the second electrode 104*b* mainly via the parasitic capacitances between the drains and the sources of the N-channel MOSFETs 12 and 15. However, the same power supply noise 209 is applied to each of the first electrode 104*a* and the second electrode 104*b*, and thus it is possible to prevent an electric field attributable to the noise from being generated between the electrodes.

In addition, when the blanking control signal is turned off, both the P-channel MOSFETs 13 and 14 are turned on. At this time, the GND noise 210 is similarly applied to each of the first electrode 104*a* and the second electrode 104*b*, and thus it is possible to prevent an electric field attributable to the noise from being generated between the electrodes.

In addition, according to the present embodiment, even in a case where the power supply noise 209 and the GND noise 210 are large, no noise electric field is generated between the electrodes of the blanking electrode 104 and noise reduction can be realized. Accordingly, the inter-electrode distance of the blanking electrode 104 can be designed to be short. The sensitivity of the blanking electrode 104 (deflection distance per applied voltage) increases as the inter-electrode distance decreases. Accordingly, by reducing the inter-electrode distance, the sensitivity required for deflecting a highly accelerated electron beam can be obtained simply with the pair of blanking electrodes 104. In addition, it is not necessary to increase the blanking voltage in order to deflect the highly accelerated electron beam. Further, it is not necessary to insert a filter circuit for noise reduction into the blanking control circuit 201. Accordingly, the blanking response speed can be improved (switching can be expedited between irradiating the sample 109 with the electron beam 102 illustrated in FIG. 1 and blocking the electron beam 102 illustrated in FIG. 1).

From the above, it is possible to reduce an effect on an electron beam attributable to the power supply noise 209 and the GND noise 210 generating an inter-electrode electric field when the blanking is OFF. In other words, the measurement accuracy of the charged particle beam device can be improved, and thus the performance of the charged particle beam device can be improved.

Although a case where a MOSFET is used as the FET element used in the switching circuits 202 to 205 has been described here, the FET element may be, for example, a bipolar transistor. In that case, the gate, the source, and the drain that are the terminals of the MOSFET of the above embodiment are replaced with a base, an emitter, and a collector that are bipolar transistor terminals, respectively. In other words, for example, each of the N-channel MOSFETs 12 and 15 illustrated in FIG. 4 is replaced with an NPN-type bipolar transistor and each of the P-channel MOSFETs 13 and 14 is replaced with a PNP-type bipolar transistor. The emitter terminals of the NPN-type bipolar transistors replacing the N-channel MOSFETs 12 and 15 are connected to the voltage source 206, and the emitter terminals of the PNP-type bipolar transistors replacing the P-channel MOSFETs 13 and 14 are connected to the common GND 208. In addition, the collector terminals of the NPN-type bipolar transistor replacing the N-channel MOSFET 12 and the PNP-type bipolar transistor replacing the P-channel MOSFET 13 are connected to the first electrode 104*a*. The collector terminals of the PNP-type bipolar transistor replacing the P-channel MOSFET 14 and the NPN-type bipolar transistor replacing the N-channel MOSFET 15 are connected to the second electrode 104*b*.

FIRST MODIFICATION EXAMPLE

FIG. 5 illustrates a circuit diagram of the blanking control circuit 201 in a first modification example of the present embodiment. The blanking control circuit 201 in FIG. 5 is different from the blanking control circuit 201 in FIG. 4 in that the voltage source 206 outputs (generates) a positive voltage (VDD), the switching circuits 202 and 205 (see FIG. 2) are configured by P-channel MOSFETs, and the switching circuits 203 and 204 (see FIG. 2) are configured by N-channel MOSFETs.

In FIG. 5, when the blanking control signal is ON, the driver circuit 207 connects the positive voltage (VDD) to the first electrode 104*a* and connects the common GND 208 to the second electrode 104*b* by turning on a P-channel MOSFET 22 and an N-channel MOSFET 24 and turning off an N-channel MOSFET 23 and a P-channel MOSFET 25. As a result, a blanking electric field is generated between the electrodes and the electron beam 102 can be deflected.

In addition, when the blanking control signal is OFF, the driver circuit 207 connects the common GND 208 to the first electrode 104*a* and the second electrode 104*b* by turning off the P-channel MOSFETs 22 and 25 and turning on the N-channel MOSFETs 23 and 24. At this time, the GND noise 210 is applied with the same amplitude and phase to the first electrode 104*a* and the second electrode 104*b* via the N-channel MOSFETs 23 and 24, respectively. Accordingly, the GND noise 210 generates no electric field between the electrodes. In addition, the power supply noise 209 is applied with the same amplitude and phase to the first electrode 104*a* and the second electrode 104*b* via the parasitic capacitances of the P-channel MOSFETs 22 and 25, respectively. Accordingly, the power supply noise 209 generates no electric field between the electrodes. Accordingly, noise reduction can be realized.

SECOND MODIFICATION EXAMPLE

FIG. 6 illustrates a circuit diagram of the blanking control circuit 201 in a second modification example of the present embodiment. The blanking control circuit 201 in FIG. 6 is different from the blanking control circuit 201 in FIG. 2 in that the switching circuits 202 and 205 are replaced with resistors 32 and 35 and the switching circuits 203 and 204 are configured by P-channel MOSFETs 33 and 34. By using resistors (resistor elements) in this manner, the driver circuit 207 may perform ON/OFF control only on the P-channel MOSFETs 33 and 34. In addition, resistors of the same type, resistors of the same notation, or resistors of the same resistance value are used as the resistors 32 and 35. As a result, the impedances of the respective paths from the voltage source 206 to the first electrode 104*a* and the second electrode 104*b* can be matched. The configurations of the P-channel MOSFETs 33 and 34 are the same as the configurations of the P-channel MOSFETs 13 and 14 illustrated in FIG. 4, respectively.

In FIG. 6, when the blanking control signal is ON, the driver circuit 207 connects the negative voltage (VSS) to the first electrode 104*a* via the resistor 32 and connects the common GND 208 to the second electrode 104*b* via the P-channel MOSFET 34 by turning off the P-channel MOS- FET 33 and turning on the P-channel MOSFET 34. As a result, a blanking electric field is generated between the electrodes and the electron beam 102 can be deflected.

In addition, when the blanking control signal is OFF, the driver circuit 207 connects the common GND 208 to the first electrode 104*a* and the second electrode 104*b* by turning on the P-channel MOSFETs 33 and 34. At this time, the GND noise 210 is applied with the same amplitude and phase to the first electrode 104*a* and the second electrode 104*b* via the P-channel MOSFETs 33 and 34, respectively. Accordingly, the GND noise 210 generates no electric field between the electrodes. In addition, the power supply noise 209 is applied with the same amplitude and phase to the first electrode 104*a* and the second electrode 104*b* via the resistors 32 and 35, respectively. Accordingly, the power supply noise 209 generates no electric field between the electrodes. Accordingly, noise reduction can be realized.

THIRD MODIFICATION EXAMPLE

FIG. 7 illustrates a circuit diagram of the blanking control circuit 201 in a third modification example of the present embodiment. The blanking control circuit 201 in FIG. 7 is different from the blanking control circuit 201 in FIG. 2 in that the switching circuits 203 and 204 are replaced with resistors 43 and 44 and the switching circuits 202 and 205 are configured by N-channel MOSFETs 42 and 45. By using resistors (resistor elements) in this manner, the driver circuit 207 may perform ON/OFF control only on the N-channel MOSFETs 42 and 45. In addition, resistors of the same type, resistors of the same notation, or resistors of the same resistance value are used as the resistors 43 and 44. As a result, the impedances of the respective paths from the common GND 208 to the first electrode 104*a* and the second electrode 104*b* can be matched. The configurations of the N-channel MOSFETs 42 and 45 are the same as the configurations of the N-channel MOSFETs 12 and 15 illustrated in FIG. 4, respectively.

In FIG. 7, when the blanking control signal is ON, the driver circuit 207 connects the negative voltage (VSS) to the first electrode 104*a* and connects the common GND 208 to the second electrode 104*b* via the resistor 44 by turning on the N-channel MOSFET 42 and turning off the N-channel MOSFET 45. As a result, a blanking electric field is generated between the electrodes and the electron beam 102 can be deflected.

In addition, when the blanking control signal is OFF, the driver circuit 207 connects the common GND 208 to the first electrode 104*a* and the second electrode 104*b* via the resistors 43 and 44 by turning off the N-channel MOSFETs 42 and 45. At this time, the GND noise 210 is applied with the same amplitude and phase to the first electrode 104*a* and the second electrode 104*b* via the resistors 43 and 44, respectively. Accordingly, the GND noise 210 generates no electric field between the electrodes. In addition, the power supply noise 209 is applied with the same amplitude and phase to the first electrode 104*a* and the second electrode 104*b* via the N-channel MOSFETs 42 and 45, respectively. Accordingly, the power supply noise 209 generates no electric field between the electrodes. Accordingly, noise reduction can be realized.

Second Embodiment

Next, a second embodiment will be described. In the present embodiment, a charged particle beam device capable of adjusting the amount of noise mixed into the blanking electrode 104 will be described. It should be noted that points common to the first and second embodiments will not be described below in principle.

FIG. 8 illustrates a circuit diagram of the blanking control circuit 201 according to the present embodiment.

Although the configuration illustrated in FIG. 8 is similar to the configuration illustrated in FIG. 4, the former is different from the latter in that variable capacitance capacitors 211 and 214 and variable resistors 212 and 213 are provided.

As illustrated in FIG. 8, the variable capacitance capacitor 211 is connected between the drain and source terminals of the N-channel MOSFET 12, and the variable capacitance capacitor 214 is connected between the drain and source terminals of the N-channel MOSFET 15. In other words, the variable capacitance capacitor 211 is connected in parallel to the N-channel MOSFET 12 and the variable capacitance capacitor 214 is connected in parallel to the N-channel MOSFET 15. In addition, the variable resistor 212 is connected in series between the common GND 208 and the source terminal of the P-channel MOSFET 13 and the variable resistor 213 is connected in series between the common GND 208 and the source terminal of the P-channel MOSFET 14.

The variable capacitance capacitors 211 and 214 are provided for the purpose of reducing the individual difference in parasitic capacitance value between the drain and source terminals between the N-channel MOSFETs 12 and 15. In other words, as for the variable capacitance capacitors 211 and 214, it is desirable that the value obtained by adding the parasitic capacitance between the drain and source terminals of the N-channel MOSFET 12 to the capacitance value of the variable capacitance capacitor 211 is set to match the value obtained by adding the parasitic capacitance between the drain and source terminals of the N-channel MOSFET 15 to the capacitance value of the variable capacitance capacitor 214.

In addition, the variable resistors 212 and 213 are provided for the purpose of reducing the individual difference in on-resistance value between the drain and source terminals between the P-channel MOSFETs 13 and 14. In other words, as for the variable resistors 212 and 213, it is desirable that the value obtained by adding the on-resistance between the drain and source terminals of the P-channel MOSFET 13 to the resistance value of the variable resistor 212 is set to match the value obtained by adding the on-resistance between the drain and source terminals of the P-channel MOSFET 14 to the resistance value of the variable resistor 213.

As a result of the above, when the blanking control signal is OFF, the impedances of the respective paths from the voltage source 206 to the first electrode 104*a* and the second electrode 104*b* can be matched. In addition, the impedances of the respective paths from the common GND 208 to the first electrode 104*a* and the second electrode 104*b* can also be matched. As a result, the power supply noise 209 and the GND noise 210 are applied to the first electrode 104*a* and the second electrode 104*b* with the same amplitude and phase, respectively. Accordingly, no noise electric field is generated and noise can be reduced.

It should be noted that the overall control unit 600 may receive image data from the signal detection and image processing unit 300 and an adjustment may be made so as to maximize the image quality evaluated using an evaluation index such as resolution and contrast, which is another method for adjusting the variable capacitance capacitors 211 and 214 and the variable resistors 212 and 213. The variable capacitance capacitor and the variable resistor can be adjusted in an analog manner and manually by a user. In addition, the variable capacitance capacitor and the variable resistor can be digitally controlled from the overall control unit 600 and the capacitance value and the resistance value at which the image quality is maximized can be automatically adjusted by a program incorporated in the overall control unit 600.

In the present embodiment, the variable capacitance capacitors 211 and 214 and the variable resistors 212 and 213 are provided and the capacitance value and the resistance value are adjusted such that the wiring impedances from the blanking control circuit 201 to the first electrode 104*a* and the second electrode 104*b* are aligned. According to this configuration, the power supply noise 209 and the GND noise 210 are applied to the first electrode 104*a* and the second electrode 104*b* with the same amplitude and phase, and thus no noise electric field is generated in the blanking electrode 104 and noise can be reduced.

It should be noted that the variable resistor 212 may be connected in series between the drain terminal of the P-channel MOSFET 13 and the first electrode 104*a* and the variable resistor 213 may be connected in series between the drain terminal of the P-channel MOSFET 14 and the second electrode 104*b*. In addition, one of the variable capacitance capacitors 211 and 214 may be provided with the other not provided. Further, one of the variable resistors 212 and 213 may be provided with the other not provided.

Third Embodiment

Next, a third embodiment will be described. In the present embodiment, a charged particle beam device capable of improving the response speed when the blanking control signal is switched from ON to OFF will be described. It should be noted that points common to the first to third embodiments will not be described below in principle.

FIG. 9 is a circuit diagram illustrating an example of the configuration of the blanking control circuit 201 according to the third embodiment of the present invention. Although the configuration illustrated in FIG. 9 is similar to the configuration illustrated in FIG. 4, the former is different from the latter in that diodes 215 and 216 are provided.

As illustrated in FIG. 9, the diode 215 has an anode terminal connected to the drain terminal of the P-channel MOSFET 13 and a cathode terminal connected to the source side of the P-channel MOSFET 13 and the diode 216 has an anode terminal connected to the drain terminal of the P-channel MOSFET 14 and a cathode terminal connected to the source side of the P-channel MOSFET 14. In other words, the diode 215 is connected in parallel to the P-channel MOSFET 13 and the diode 216 is connected in parallel to the P-channel MOSFET 14.

FIG. 10 is a waveform diagram illustrating waveform examples of (1) a blanking control signal S1, (2) a voltage (Va) applied to the first electrode 104*a*, and (3) a voltage (Vb) applied to the second electrode 104*b*. When the blanking control signal S1 is ON, the N-channel MOSFET 12 is ON, and thus the voltage (Va) of the first electrode 104*a* is VSS. In addition, when the blanking control signal S1 is ON, the P-channel MOSFET 14 is ON, and thus the voltage (Vb) of the second electrode 104*b* is the common GND potential.

When the blanking control signal S1 is switched from ON to OFF, the N-channel MOSFET 12 changes to OFF and the P-channel MOSFET 13 changes to ON, a current flows from the common GND 208 toward the first electrode 104*a* via the P-channel MOSFET 13, and the voltage (Va) of the first electrode 104*a* changes to the common GND potential. At this time, a positive voltage (Vs) is induced in the second electrode 104*b* facing the first electrode 104*a*. Subsequently, a current flows through the common GND 208 via the on-resistance of the P-channel MOSFET 14, and thus the voltage (Vb) of the second electrode 104*b* becomes the common GND potential after a certain period of time (Ts) elapses.

Here, the positive voltage (Vs), which is an induced voltage, can be limited to the forward voltage of the diode 216 or less by the diode 216 being inserted. Accordingly, the time (Ts) until the second electrode 104*b* reaches the common GND potential can be shortened and the response time can be reduced as compared with a case where the diode 216 is not inserted.

In the blanking control circuit 201 in the present embodiment, switching circuits having the same configuration are connected to the first electrode 104*a* and the second electrode 104*b*. Accordingly, a blanking electric field can be applied in the direction from the first electrode 104*a* to the second electrode 104*b* by changing the switching circuit ON/OFF control method. The diode 215 contributes to response time reduction in the same manner as the diode 216 in a case where a blanking electric field application operation is performed in this manner.

MODIFICATION EXAMPLE

FIG. 11 is a circuit diagram illustrating a second configuration example of the blanking control circuit 201 according to the third embodiment of the present invention. Although the configuration illustrated in FIG. 11 is similar to the configuration illustrated in FIG. 5, the former is different from the latter in that the diodes 215 and 216 are provided.

As illustrated in FIG. 11, the diode 215 has an anode terminal connected to the source side of the N-channel MOSFET 23 and a cathode terminal connected to the drain terminal of the N-channel MOSFET 23 and the diode 216 has an anode terminal connected to the source terminal of the N-channel MOSFET 24 and a cathode terminal connected to the drain side of the N-channel MOSFET 24. In other words, the diode 215 is connected in parallel to the N-channel MOSFET 23 and the diode 216 is connected in parallel to the N-channel MOSFET 24.

FIG. 12 is a waveform diagram illustrating waveform examples of (1) the blanking control signal S1, (2) the voltage (Va) applied to the first electrode 104*a*, and (3) the voltage (Vb) applied to the second electrode 104*b*. When the blanking control signal S1 is ON, the P-channel MOSFET 22 is ON, and thus the voltage (Va) of the first electrode 104*a* is VDD. In addition, when the blanking control signal S1 is ON, the N-channel MOSFET 24 is ON, and thus the voltage (Vb) of the second electrode 104*b* becomes the common GND potential.

When the blanking control signal S1 is switched from ON to OFF, the P-channel MOSFET 22 changes to OFF and the N-channel MOSFET 23 changes to ON, a current flows from the first electrode 104*a* toward the common GND 208 via the N-channel MOSFET 23, and the voltage (Va) of the first electrode 104*a* changes to the common GND potential. At this time, a negative voltage (Vd) is induced in the second electrode 104*b* facing the first electrode 104*a*. Subsequently, a current flows through the second electrode 104*b* via the on-resistance of the N-channel MOSFET 24 from the common GND 208, and thus the voltage (Vb) of the second electrode 104*b* becomes the common GND potential after a certain period of time (Td) elapses. Here, the negative voltage (Vd), which is an induced voltage, can be suppressed by the forward voltage of the diode 216 by the diode 216 being inserted. Accordingly, the time (Td) until the second electrode 104*b* reaches the common GND potential can be shortened and the response time can be reduced as compared with a case where the diode 216 is not inserted.

The diode 215 contributes to response time reduction in the same manner as the diode 216 in a case where a blanking electric field application operation is performed in the direction from the second electrode 104*b* to the first electrode 104*a*.

According to the present embodiment, the response speed when the blanking control signal changes from ON to OFF can be increased by providing the diodes 215 and 216.

Fourth Embodiment

Next, a fourth embodiment will be described. In the present embodiment, a charged particle beam device capable of reducing the noise electric field generated between the electrodes even in a case where the noise applied to the first electrode and the noise applied to the second electrode do not have the same amplitude and phase will be described. It should be noted that points common to the first to fourth embodiments will not be described below in principle.

FIG. 13 is a circuit diagram illustrating an example of the configuration of the blanking control circuit 201 according to the fourth embodiment of the present invention. Although the configuration illustrated in FIG. 13 is similar to the configuration illustrated in FIG. 4, the former is different from the latter in that resistors 217 and 218 are provided.

FIG. 14 is a graph illustrating an example of the frequency characteristics of the noise voltage (Va–Vb) applied to the blanking electrode 104 when the noise between a connection point P1 and a connection point P2 is 1 at a low frequency. In FIG. 14, the solid line is a graph in a case where there is no resistance, the two-dot chain line is a graph in a case where the resistance value is small, and the one-dot chain line is a graph in a case where the resistance value is large.

As illustrated in FIG. 13, the resistor 217 is inserted between the connection point P1 between the drain terminals of the N-channel MOSFET 12 and the P-channel MOSFET 13 and the first electrode 104*a*. In other words, the resistor 217 is connected in series between the connection point P1 and the first electrode 104*a*. The resistor 218 is inserted between the connection point P2 between the drain terminals of the P-channel MOSFET 14 and the N-channel MOSFET 15 and the second electrode 104*b*. In other words, the resistor 218 is connected in series between the connection point P2 and the second electrode 104*b*.

Noise increases in the vicinity of the resonance point (frequency: Fc) formed by the inductance components of signal wirings L1 and L2 between the blanking control circuit 201 and the blanking electrode 104 and the inter-electrode capacitance of the blanking electrode 104. As illustrated in FIG. 14, the increase in noise at the resonance point can be reduced by inserting the resistors 217 and 218, and the reduction effect increases as the resistance value increases. However, the increase in resistance value leads to a decline in blanking response speed attributable to a low-pass filter effect, and thus it is desirable that the resistance value is approximately several tens of Ω to several hundreds of Ω. In addition, the resistors 217 and 218 are matched in terms of wiring impedance by using resistors of the same type, resistors of the same notation, or resistors of the same resistance value as the resistors 217 and 218. As a result, the power supply noise 209 and the GND noise 210 can be applied to the first electrode 104*a* and the second electrode 104*b* with the same amplitude and phase, and thus noise can be reduced.

According to the present embodiment, by providing the resistors 217 and 218, the resonance formed by the blanking wiring (signal wirings L1 and L2) and the blanking electrode can be suppressed and the noise applied to the blanking electrode can be reduced.

Fifth Embodiment

Next, a fifth embodiment will be described. In the present embodiment, a charged particle beam device capable of forming blanking electric fields in four directions by providing four electrode plates on the same plane will be described.

As a problem that may arise in a charged particle beam device performing blanking, it is conceivable that the blanking leads to contamination adhesion at the electron beam irradiation part of the aperture 111 (see FIG. 1). In particular, in a case where the blanking is unidirectionally performed at all times, that is, in the case of unidirectional electron beam deflection, contamination locally adheres to the electron beam irradiation part and dirtiness arises. The contamination adhesion part is charged as a result of the electron beam irradiation resulting from the blanking, and an electric field is generated. Accordingly, the electron beam is affected by the electric field resulting from the charging of the contamination part, and there may be a problem that the scanning position on the sample 109 (see FIG. 1) deviates.

In the present embodiment, blanking in four directions is realized to solve the above problem. Points common to the above described embodiments will not be described below in principle.

FIG. 15 is a circuit diagram illustrating an example of the configuration of the blanking control circuit 201 and the blanking electrode 104 according to the fifth embodiment of the present invention. The blanking electrode 104 in the present embodiment includes two sets of two electrodes facing each other in a direction perpendicular to the irradiation direction of the electron beam 102 with the irradiation position of the electron beam 102 in the air in the middle. One of the two sets of electrodes is a first electrode 301*a* and a second electrode 301*b*, and the other is a third electrode 301*c* and a fourth electrode 301*d*.

The blanking control circuit 201 includes the N-channel MOSFETs 12 and 15, N-channel MOSFETs 52 and 55, the P-channel MOSFETs 13 and 14, P-channel MOSFETs 53 and 54, the voltage source 206 generating the negative voltage (VSS), and the driver circuit 207 performing MOSFET ON/OFF control based on a blanking control signal from the overall control unit 600 (see FIG. 1). The negative voltage (VSS) output of the voltage source 206 is connected to the respective source terminals of the N-channel MOSFETs 12, 15, 52, and 55. The common GND 208 provided on the blanking control circuit 201 is connected to the respective source terminals of the P-channel MOSFETs 13, 14, 53, and 54. The gate terminal of every MOSFET is connected to the driver circuit 207.

In addition, the drain terminals of the N-channel MOSFET 12 and the P-channel MOSFET 13 are connected to each other and connected to the first electrode 301*a*. The drain terminals of the P-channel MOSFET 14 and the N-channel MOSFET 15 are connected to each other and connected to the second electrode 301*b*. The drain terminals of the N-channel MOSFET 52 and the P-channel MOSFET 53 are connected to each other and connected to the third electrode 301*c*. The drain terminals of the P-channel MOSFET 54 and the N-channel MOSFET 55 are connected to each other and connected to the fourth electrode 301*d*.

FIG. 16 is a plan view illustrating the positional relationship of the deflection directions of the electron beam 102 resulting from the blanking in the present embodiment. In FIG. 16, the irradiation direction of the electron beam 102 is viewed from the side of the charged particle gun 101 emitting the electron beam 102. In FIG. 16, in a case where the electron beam 102 is deflected in a direction A1, the negative voltage (VSS) may be connected to the first electrode 301*a* and the fourth electrode 301*d* and the common GND 208 may be connected to the second electrode 301*b* and the third electrode 301*c*. As a result, the blanking electric field applied in the direction from the second electrode 301*b* to the first electrode 301*a* and the blanking electric field applied in the direction from the third electrode 301*c* to the fourth electrode 301*d* are added. As a result, a blanking electric field is formed in a direction A2, and the electron beam 102 is deflected in the direction A1 opposite to the blanking electric field.

In addition, in a case where the electron beam 102 is deflected in any of the direction A2, a direction A3, and a direction A4, the operation of the blanking control circuit 201 may be controlled such that the common GND 208 is connected to the electrodes disposed on both sides in the desired deflection direction and the negative voltage (VSS) is connected to the remaining electrode. Here, the operation of the blanking control circuit 201 will be described as to a case where a blanking electric field is applied in the direction A1 as an example.

In FIG. 15, when the blanking control signal is ON, the driver circuit 207 connects the negative voltage (VSS) to each of the first electrode 301*a* and the fourth electrode 301*d* by turning on the N-channel MOSFETs 12 and 55 and turning off the P-channel MOSFETs 13 and 54. In addition, the driver circuit 207 connects the common GND 208 to each of the second electrode 301*b* and the third electrode 301*c* by turning on the P-channel MOSFETs 14 and 53 and turning off the N-channel MOSFETs 15 and 52. As a result, a blanking electric field is generated in the direction A2 in FIG. 16, and the electron beam 102 can be deflected in the direction A1.

When the blanking control signal is OFF, the driver circuit 207 connects the common GND 208 to the first electrode 301*a* and the fourth electrode 301*d* by turning off the N-channel MOSFETs 12 and 55 and turning on the P-channel MOSFETs 13 and 54.

In addition, the driver circuit 207 connects the common GND 208 to the second electrode 301*b* and the third electrode 301*c* by turning on the P-channel MOSFETs 14 and 53 and turning off the N-channel MOSFETs 15 and 52. As a result, the common GND 208 is connected to every electrode and no blanking electric field is generated. At this time, the GND noise 210 is applied with the same amplitude and phase to the first electrode 301*a* to the fourth electrode 301*d* via the P-channel MOSFETs 13, 14, 53, and 54, respectively. Accordingly, the GND noise 210 generates no noise electric field between the electrodes. In addition, the power supply noise 209 is applied with the same amplitude and phase to the first electrode 301*a* to the fourth electrode 301*d* via the parasitic capacitances between the drain and source terminals of the N-channel MOSFETs 12, 15, 52, and 55, respectively. Accordingly, the power supply noise 209 generates no electric field between the electrodes, either. Accordingly, noise reduction can be realized.

According to the present embodiment, the blanking control circuit 201 in which four blanking electrode plates are provided and a switching circuit is connected to each of the electrode plates is provided, and thus blanking electric fields can be formed in four directions. As a result, in irradiating the aperture 111 (see FIG. 1) with an electron beam by blanking, the irradiation with the electron beam can be performed with a selection made within a wide range on the upper surface of the aperture 111. Accordingly, local electron beam irradiation at a part of the aperture 111 can be prevented, and thus it is possible to prevent local contamination adhesion and scanning position deviation on the sample 109 (see FIG. 1) attributable to charging. In addition, the life of the aperture 111 can be extended. In addition, the power supply noise 209 and the GND noise 210 are applied to the four electrode plates with the same amplitude and phase, and thus no noise electric field is generated between the electrodes and noise reduction can be realized.

A configuration in which four blanking electrode plates are provided has been described in the present embodiment. In an alternative configuration, more electrode plates can be provided and deflection can be performed in more blanking directions. Such a configuration can be realized by providing the blanking control circuit 201 in which a switching circuit is connected to each electrode plate as described in the present embodiment and selectively controlling the switching circuit with the driver circuit 207.

Sixth Embodiment

Next, a sixth embodiment will be described. In the present embodiment, a charged particle beam device capable of deflecting an electron beam at a large angle by arranging two sets of facing electrode plates above and below will be described. It should be noted that points common to the first to sixth embodiments will not be described below in principle.

FIG. 17 is a circuit diagram illustrating an example of the configuration of the blanking control circuit 201 and the blanking electrode 104 according to the present sixth embodiment. Although the configuration illustrated in FIG. 17 is similar to the configuration illustrated in FIG. 15, the former is different from the latter in terms of the disposition of the blanking electrode 104.

As illustrated in FIG. 17, the blanking electrode 104 in the present embodiment has a configuration in which two sets of two electrodes facing each other in a direction perpendicular to a plane are disposed in upper and lower stages with the plane along the irradiation direction of the electron beam 102 in the middle. Of these two sets of electrodes, the upper set is the first electrode 301*a* and the second electrode 301*b* disposed parallel to each other and close to the irradiation position of the electron beam 102. In addition, of these two sets of electrodes, the lower set is the third electrode 301*c* and the fourth electrode 301*d* disposed parallel to each other and close to the irradiation position of the electron beam 102.

FIGS. 18 to 21 are side views illustrating the positional relationships of the deflection directions of the electron beam 102 resulting from the blanking in the present embodiment. FIG. 18 illustrates a case where the electron beam 102 is deflected in the direction A1, in which a blanking electric field is applied in the same direction with the upper and lower electrodes to deflect the electron beam 102 in the direction A1, the negative voltage (VSS) may be connected to the first electrode 301*a* and the fourth electrode 301*d*, and the common GND 208 may be connected to the second electrode 301*b* and the third electrode 301*c*. As a result, a blanking electric field is generated in the direction from the second electrode 301*b* to the first electrode 301*a*, a blanking electric field is generated in the direction from the third electrode 301*c* to the fourth electrode 301*d*, and the electron beam 102 is deflected in the direction A1 as a result.

In addition, as illustrated in FIG. 19, in a case where the electron beam 102 is deflected in the direction A2, the negative voltage (VSS) may be connected to the first electrode 301*a* and the third electrode 301*c* and the common GND may be connected to the second electrode 301*b* and the fourth electrode 301*d*.

In addition, as illustrated in FIG. 20, in a case where the electron beam 102 is deflected in the direction A3, the negative voltage (VSS) may be connected to the second electrode 301*b* and the fourth electrode 301*d* and the common GND may be connected to the first electrode 301*a* and the third electrode 301*c*.

In addition, as illustrated in FIG. 21, in a case where the electron beam 102 is deflected in the direction A4, the negative voltage (VSS) may be connected to the second electrode 301*b* and the third electrode 301*c* and the common GND may be connected to the first electrode 301*a* and the fourth electrode 301*d*.

Regarding blanking electric field application in each direction, the operation of the blanking control circuit 201 is the same as that of the fifth embodiment, and thus the description thereof will be omitted.

According to the present embodiment, the blanking control circuit 201 in which four blanking electrode plates are provided and a switching circuit is connected to each of the electrode plates is provided, and thus the four blanking electric fields illustrated in FIGS. 17 to 21 can be formed. In addition, as in the fifth embodiment, the power supply noise 209 and the GND noise 210 are applied to the four electrode plates with the same amplitude and phase, and thus no noise electric field is generated between the electrodes and noise reduction can be realized.

A configuration in which four blanking electrode plates are provided has been described in the present embodiment. In an alternative configuration, more electrode plates can be provided and deflection can be performed in more blanking directions. This case can be realized by providing the blanking control circuit 201 in which a switching circuit is connected to each electrode plate as described in the present embodiment and selectively controlling the switching circuit with the driver circuit 207.

Although the invention made by the present inventors has been specifically described above based on embodiments thereof, the present invention is not limited to the embodiments and can be variously modified without departing from the gist thereof.

For example, although the description has been made using a MOSFET as a switching circuit in the first to sixth embodiments, the present invention is not limited thereto and various elements and circuits having a switching function can be used. In other words, a bipolar transistor may be used instead of the MOSFET as described in the first embodiment.

The present invention can be widely used in charged particle beam devices performing blanking.

REFERENCE SIGNS LIST

12, 15, 23, 24, 42, 45, 52, 55: N-channel MOSFET
13, 14, 22, 25, 33, 34, 53, 54: P-channel MOSFET
101: electron gun
102: electron beam
104: blanking electrode
104*a*: first electrode
104*b*: second electrode
110: stage
111: aperture
201: blanking control circuit
202 to 205: switching circuit
206: voltage source
208: common ground
209: power supply noise
210: GND noise

The invention claimed is:

1. A charged particle beam device comprising:

a stage where a sample is mountable;

a charged particle gun performing charged particle emission to the sample;

a voltage source; and a blanking control circuit configured to receive a blanking control signal, wherein the blanking control circuit includes;

a common ground;

a first switching circuit to which a voltage is supplied from the voltage source;

a second switching circuit having one end connected to the common ground;

a third switching circuit having one end connected to the common ground;

a fourth switching circuit to which a voltage is supplied from the voltage source;

a first blanking electrode connected to the first switching circuit and the second switching circuit;

a second blanking electrode facing the first blanking electrode and connected to the third switching circuit and the fourth switching circuit;

a control circuit controlling the first switching circuit, the second switching circuit, the third switching circuit, and the fourth switching circuit;

a first resistor is connected in series between a first connection point between the first switching circuit and the second switching circuit and the first blanking electrode, and a second resistor is connected in series between a second connection point between the third switching circuit and the fourth switching circuit and the first blanking electrode, wherein the first switching circuit, the second switching circuit, the third switching circuit, and the fourth switching circuit are arranged to prevent an electric field from being formed between the first blanking electrode and the second blanking electrode due to a power supply noise introduced through the voltage source and a ground noise introduced through the common ground, by causing one of the power supply noise and the ground noise to be present at both of the first blanking electrode and the second blanking electrode with a same amplitude and phase when the received blanking control signal is in an OFF state, each of the first switching circuit, the second switching circuit, the third switching circuit, and the fourth switching circuit is a transistor element configured by a MOSFET or a bipolar transistor, a terminal of each of the second switching circuit and the third switching circuit connected to the common ground is a source terminal or an emitter terminal, a terminal of each of the first switching circuit and the fourth switching circuit connected to the voltage source is a source terminal or an emitter terminal, and the first and second resistors have the same resistance value.

2. The charged particle beam device according to claim 1, wherein the control circuit puts the first switching circuit and the third switching circuit into a conducting state and puts the second switching circuit and the fourth switching circuit into a non-conducting state in turning on blanking, and the control circuit puts the second switching circuit and the third switching circuit into a conducting state and puts the first switching circuit and the fourth switching circuit into a non-conducting state in turning off blanking.

3. The charged particle beam device according to claim 1, wherein the voltage source generates a negative voltage, the first switching circuit is configured by a first N-channel MOSFET, the second switching circuit is configured by a first P-channel MOSFET, the third switching circuit is configured by a second P-channel MOSFET, and the fourth switching circuit is configured by a second N-channel MOSFET.

4. The charged particle beam device according to claim 3, further comprising:

a first diode having an anode connected to a drain terminal of the first P-channel MOSFET and a cathode connected to a source terminal of the first P-channel MOSFET; and a second diode having an anode connected to a drain terminal of the second P-channel MOSFET and a cathode connected to a source terminal of the second P-channel MOSFET.

5. The charged particle beam device according to claim 1, wherein the voltage source generates a positive voltage, the first switching circuit is configured by a first P-channel MOSFET, the second switching circuit is configured by a first N-channel MOSFET, the third switching circuit is configured by a second N-channel MOSFET, and the fourth switching circuit is configured by a second P-channel MOSFET.

6. The charged particle beam device according to claim 5, further comprising:

a third diode having an anode connected to a source terminal of the first N-channel MOSFET and a cathode connected to a drain terminal of the first N-channel MOSFET; and a fourth diode having an anode connected to a source terminal of the second N-channel MOSFET and a cathode connected to a drain terminal of the second N-channel MOSFET.

7. The charged particle beam device according to claim 1, wherein a capacitance value-adjustable variable capacitance capacitor is connected in parallel to the first switching circuit or the fourth switching circuit, and a resistance value-adjustable variable resistor is connected in series to the second switching circuit or the third switching circuit.

8. A charged particle beam device comprising:

a stage where a sample is mountable;

a charged particle gun performing charged particle emission to the sample;

a voltage source configured to generate negative voltage; and a blanking control circuit configured to receive a blanking control signal, wherein the blanking control circuit includes a common ground;

a first resistor to which a voltage is supplied from the voltage source;

a first transistor switch having one end connected to the common ground;

a second transistor switch having one end connected to the common ground;

a second resistor to which a voltage is supplied from the voltage source;

a first blanking electrode connected to the first resistor and the first transistor switch circuit;

a second blanking electrode facing the first blanking electrode and connected to the second transistor switch and the second resistor; and a control circuit controlling the first resistor, the first transistor switch, the second transistor switch, the second resistor, wherein a terminal of each of the first and second transistor switches connected to the common ground is a source terminal or an emitter terminal, and wherein, the first resistor, the first transistor switch, the second transistor switch, and the second resistor are arranged to prevent an electric field from being formed between the first blanking electrode and the second blanking electrode due to a power supply noise introduced through the voltage source and a ground noise introduced through the common ground, by causing one of the power supply noise and the ground noise to be present at both of the first blanking electrode and the second blanking electrode with a same amplitude and phase when the received blanking control signal is in an OFF state.

9. A charged particle beam device comprising:

a stage where a sample is mountable;

a charged particle gun performing charged particle emission to the sample;

a voltage source configured to generate negative voltage; and a blanking control circuit configured to receive a blanking control signal, wherein the blanking control circuit includes a common ground;

a first transistor switch to which a voltage is supplied from the voltage source;

a first resistor having one end connected to the common ground;

a second resistor having one end connected to the common ground;

a second transistor switch to which a voltage is supplied from the voltage source;

a first blanking electrode connected to the first resistor and the first transistor switch circuit;

a second blanking electrode facing the first blanking electrode and connected to the second transistor switch and the second resistor; and a control circuit controlling the first transistor switch and the second transistor switch, wherein a terminal of each of the first and second transistor switches connected to the voltage source is a source terminal or an emitter terminal, and wherein, the first resistor, the first transistor switch, the second transistor switch, and the second resistor are arranged to prevent an electric field from being formed between the first blanking electrode and the second blanking electrode due to a power supply noise introduced through the voltage source and a ground noise introduced through the common ground, by causing one of the power supply noise and the ground noise to be present at both of the first blanking electrode and the second blanking electrode with a same amplitude and phase when the received blanking control signal is in an OFF state.

* * * * *